(12) United States Patent
Disteldorf et al.

(10) Patent No.: US 7,923,063 B2
(45) Date of Patent: Apr. 12, 2011

(54) METHOD OF MAKING GLASS INCLUDING SURFACE TREATMENT WITH ALUMINUM CHLORIDE USING COMBUSTION DEPOSITION PRIOR TO DEPOSITION OF ANTIREFLECTIVE COATING

(75) Inventors: Bernd Disteldorf, Mettlach (DE); Pramod K. Sharma, Ann Arbor, MI (US); Nathan P. Mellott, Northville, MI (US)

(73) Assignees: Centre Luxembourgeois de Recherches pour le Verre et la Ceramique S.A. (C.R.V.C.), Grand Duche de Luxembourg (LU); Guardian Industries Corp., Arburn Hills, MI (US)

( * ) Notice: Subject to any disclaimer, the term of this patent is extended or adjusted under 35 U.S.C. 154(b) by 528 days.

(21) Appl. No.: 12/000,200

(22) Filed: Dec. 10, 2007

(65) Prior Publication Data
US 2009/0148709 A1   Jun. 11, 2009

(51) Int. Cl.
*B05D 5/06* (2006.01)
(52) U.S. Cl. ............................................. 427/166
(58) Field of Classification Search .............. 427/162, 427/166, 74; 65/60.1
See application file for complete search history.

(56) References Cited

U.S. PATENT DOCUMENTS

| | | | |
|---|---|---|---|
| 4,228,206 A | 10/1980 | Fabisak | |
| 5,054,355 A | 10/1991 | Tisse et al. | |
| 5,510,144 A | 4/1996 | Cordie | |
| 5,652,021 A | 7/1997 | Hunt et al. | |
| 5,782,949 A | 7/1998 | Marique et al. | |
| 5,858,465 A | 1/1999 | Hunt et al. | |
| 5,948,132 A | 9/1999 | Maltby, Jr. et al. | |
| 6,013,318 A | 1/2000 | Hunt et al. | |
| 6,193,911 B1 | 2/2001 | Hunt et al. | |
| 6,602,371 B2 | 8/2003 | Veerasamy | |
| 6,711,917 B2 | 3/2004 | Landa et al. | |
| 6,713,178 B2 | 3/2004 | Veerasamy | |
| 6,716,780 B2 | 4/2004 | Landa et al. | |
| 6,796,146 B2 | 9/2004 | Burnham | |
| 6,853,433 B2 | 2/2005 | Kim et al. | |
| 6,949,484 B2 | 9/2005 | Landa et al. | |
| 6,953,759 B2 | 10/2005 | Landa et al. | |

(Continued)

FOREIGN PATENT DOCUMENTS
DE   2 160 723   6/1973
(Continued)

OTHER PUBLICATIONS

XP-002508698 "HYDRATE", Nachod et al., 1934 Verlag Chemie, Berlin, pp. 193-194.

(Continued)

*Primary Examiner* — Timothy H Meeks
*Assistant Examiner* — Elizabeth Burkhart
(74) *Attorney, Agent, or Firm* — Nixon & Vanderhye P.C.

(57) ABSTRACT

This invention relates to a method of making glass. In certain example embodiments, a major surface(s) of the glass is treated with aluminum chloride (e.g., $AlCl_3$). This treating, or application of an aluminum chloride based layer on the glass substrate, may be performed using combustion deposition. The combustion deposition may be performed at or just prior to the annealing lehr in certain example embodiments, or at any other suitable location. The aluminum chloride barrier layer, applied at a desirable glass temperature, helps to reduce sodium leaching or diffusion from the glass during conditions such as high heat and/or humidity, thereby improving the durability and/or stability of the resulting product.

18 Claims, 4 Drawing Sheets

U.S. PATENT DOCUMENTS

| | | |
|---|---|---|
| 2007/0030569 A1 | 2/2007 | Lu et al. |
| 2007/0031655 A1 | 2/2007 | Taylor |
| 2007/0113881 A1 | 5/2007 | Mellott et al. |
| 2007/0116966 A1 | 5/2007 | Mellott et al. |
| 2007/0141349 A1* | 6/2007 | Hessenkemper et al. ..... 428/410 |
| 2007/0178316 A1 | 8/2007 | Mellott |
| 2008/0022721 A1* | 1/2008 | Disteldorf et al. ............. 65/30.1 |
| 2008/0022723 A1* | 1/2008 | Disteldorf et al. ................ 65/65 |
| 2009/0101209 A1* | 4/2009 | Sharma et al. ................ 136/261 |

FOREIGN PATENT DOCUMENTS

| | | |
|---|---|---|
| GB | 835 820 | 5/1960 |
| JP | 60-176952 | 9/1985 |
| JP | 11-228172 | 8/1999 |
| SU | 988787 | 1/1983 |
| WO | WO 2004/096724 | 11/2004 |
| WO | WO 2005/087678 | 9/2005 |

OTHER PUBLICATIONS

International Search Report dated Feb. 12, 2009.
"Combustion Chemical Vapor Deposition: A Novel Thin-Film Deposition Technique", Hunt et al., 1993 American Institute of Physics, Apr. 21, 1993.
"Growth of Thin Films of Molybdenum and Tungsten Oxides by Combustion CVD using Aqueous Precursor Solutions", Davis et al., Chemical Vapor Deposition 2004, 10, No. 1, pp. 29-34.
U.S. Appl. No. 11/979,543, filed Nov. 5, 2007.
U.S. Appl. No. 11/878,318, filed Jul. 23, 2007.
U.S. Appl. No. 11/492,204, filed Jul. 25, 2006.

* cited by examiner

| Example # | Difference in T before and after the Test |
|---|---|
| Example #1 | 13.39 |
| Example #2 | 3.60 |
| Example #3 | 1.31 |
| Example #4 | 1.73 |
| Example #5 | 3.56 |
| Example #6 | 0.02 |

METHOD OF MAKING GLASS INCLUDING SURFACE TREATMENT WITH ALUMINUM CHLORIDE USING COMBUSTION DEPOSITION PRIOR TO DEPOSITION OF ANTIREFLECTIVE COATING

This invention relates to a method of making a coated article (e.g., coated glass substrate for use as a front substrate in a photovoltaic device, coated glass substrate for use as a substrate in a display, coated glass substrate for use in a picture frame, or the like). In certain example embodiments, a soda-lime-silica glass substrate is coated with aluminum chloride (e.g., $AlCl_3$) using a flame deposition or combustion deposition process. Thereafter, an antireflective (AR) coating may be applied on the substrate over the aluminum chloride based layer via a sol gel technique or the like. The presence of the aluminum chloride, deposited via flame deposition (or combustion deposition), has been found to reduce sodium (Na) leaching or diffusion from the glass during heat treatment (HT) such as thermal tempering or the like.

BACKGROUND OF THE INVENTION

Float glass (coated or uncoated) is typically soda-lime-silica based, and when coated with an AR coating or the like is susceptible to damage as a result alkalis such as sodium (Na) diffusing outwardly from the glass to the surface and possibly into coatings such as AR coatings or low-E coatings provided on the glass. This leaching or diffusing of sodium outwardly from the glass may take place during heat treatment (HT) such as thermal tempering of the coated article, or over time in environmental conditions. On uncoated glass, the sodium upon reaching the surface may react with water or the like to produce visible stains or smears on the glass surface. Moreover, sodium diffusion into coatings on the glass can damage the coatings thereby leading to defected coated articles.

As an example, in commercial applications such as photovoltaic devices, displays such as LCDs, picture frame, and the like, mono-layer AR coatings are sometimes applied on soda-lime-silica based glass substrates. Sodium ions in the glass over time, especially when subjected to high temperature and humidity conditions such as those used in accelerated aging tests and thermal tempering, migrate to the surface and the resulting increase in alkalinity can cause corrosion on the surface of the coated article. Adverse effects of sodium migration are also known in the display industry where liquid crystal material may become damaged by sodium ions migrated through transparent conductive coatings such as indium tin oxide coatings.

In photovoltaic and other applications, the sodium ions which migrate to the surface of the glass also penetrate into porous coatings of silica or the like, and cause erosion of the coatings which manifests in the form of defects in coatings especially after exposure to high temperatures and/or humidity.

It is known to treat the surface of glass with materials such as aluminum (e.g., see JP 60-176952, and WO 2004/096724 to Hessenkemper, both of which are hereby incorporated herein by reference). However, such treatments are not done in an efficient manner consistent with the manufacture of many coated articles.

In view of the above, it will be apparent that there exists a need in the art for a method of making coated articles having good durability of AR coatings on glass substrates.

SUMMARY OF EXAMPLE EMBODIMENTS OF THE INVENTION

Certain example embodiments of this invention relate to a method of making a coated article (e.g., coated glass substrate for use as a front substrate in a photovoltaic device, coated glass substrate for use as a substrate in a display, coated glass substrate for use in a picture frame, or the like). In certain example embodiments, a soda-lime-silica glass substrate is coated with aluminum chloride (e.g., $AlCl_3$) using a flame deposition or combustion deposition process. Thereafter, an antireflective (AR) coating may be applied on the substrate over the aluminum chloride based layer via a sol gel technique or the like in certain example embodiments. The use of flame deposition (which includes combustion deposition) to deposit such a coating is advantageous in that it is more efficient and cost effective than are certain conventional techniques. The presence of the aluminum chloride, deposited via flame deposition (or combustion deposition), has been found to reduce sodium (Na) leaching or diffusion from the glass during heat treatment (HT) such as thermal tempering or the like.

In certain example embodiments of this invention, there is provided a technique for enhancing chemical durability of AR coatings by using flame deposition to apply a barrier of or including aluminum chloride between the glass and the AR coating. The AR coating may be a monolayer in certain instances. The presence of the flame-deposited aluminum chloride based barrier improves the durability of the overlying coating over time, especially upon exposure to high temperature and/or high humidity conditions, and upon exposure to freezing conditions.

In certain example embodiments, coated glass discussed herein is designed for use as a front substrate of a photovoltaic device such as a solar cell, or as a cover in a picture frame. In other example embodiments, coated glass discussed herein is designed for use in flat panel displays such as PDPs, LCDs, and/or OLEDs. Sodium diffusion from the glass substrate in each case is greatly reduced by the flame-deposited barrier layer, thereby allowing for production of AR coatings or TFTs (e.g., a-Si TFTs, poly-Si TFTs, or the like) and/or other electronic devices on the glass substrate without significant deterioration of coating or display characteristics. Coated glass according to certain example embodiments of this invention may be used in one or both substrates of certain photovoltaic and/or display applications.

In certain example embodiments of this invention, there is provided method of making a coated article, the method comprising: providing soda-lime-silica based glass; using combustion deposition and at least one burner to deposit a barrier layer comprising aluminum chloride on a surface of the glass when the surface of the glass is at a temperature of at least about 400 degrees C., thereby forming the barrier layer comprising aluminum chloride on the glass; and forming an antireflective (AR) coating (including one or more layers) on the glass over at least the barrier layer comprising aluminum chloride.

In certain other example embodiments, there is provided a coated article comprising: a glass substrate; a barrier layer comprising aluminum chloride provide on the glass substrate; and an antireflective (AR) coating comprising silica provided on the glass substrate over at least the barrier layer comprising aluminum chloride.

BRIEF DESCRIPTION OF THE DRAWINGS

FIG. 5 is a table illustrating change in transmittance before/after humidity/temperature/freeze conditions as measured in connection with Examples 1-6.

DETAILED DESCRIPTION OF CERTAIN EXAMPLE EMBODIMENTS OF THIS INVENTION

Referring now more particularly to the accompany drawings in which like parts illustrate like components in the several views.

Figure 1:
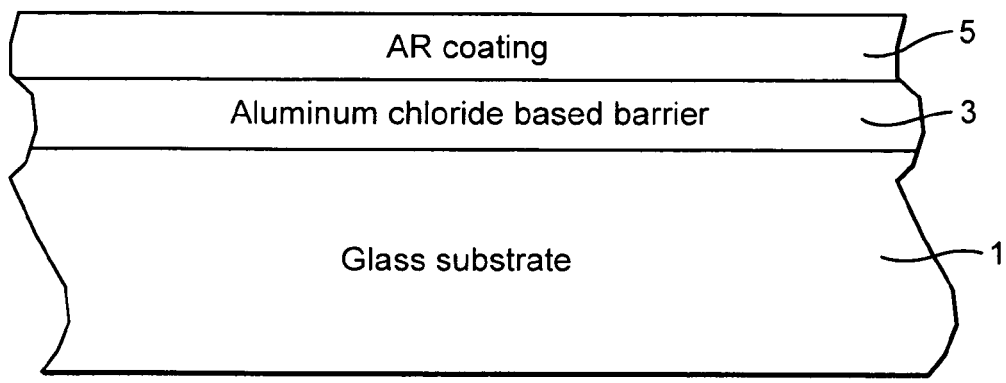
FIG. 1 is a cross sectional view of a coated glass substrate according to an example embodiment of this invention.

Certain example embodiments of this invention relate to a method of making a coated article such as a coated glass substrate for use as a front substrate in a photovoltaic device, coated glass substrate for use as a substrate in a display, coated glass substrate for use in a picture frame, or the like. Referring to FIG. 1, for instance, in certain example embodiments a soda-lime-silica based glass substrate 1 is coated with aluminum chloride (e.g., $AlCl_3$) using a flame deposition or combustion deposition process in order to form a barrier layer 3. Thereafter, an antireflective (AR) coating 5 may be applied on the substrate 1 over the aluminum chloride based layer 3 via a sol gel technique or the like in certain example embodiments. The use of flame deposition (which includes combustion deposition) to deposit such a coating 3 is advantageous in that it is more efficient and cost effective than are certain conventional techniques. The presence of the aluminum chloride 3, deposited via flame deposition (or combustion deposition), has been found to reduce sodium (Na) leaching or diffusion from the glass 1 during heat treatment (HT) such as thermal tempering or the like.

Examples 1-6 (discussed below) illustrate the surprising advantages associated with certain example embodiments of this invention. By comparing Comparative Examples 1-3 with Examples 4-6, the addition of the aluminum chloride based barrier layer 3 deposited via combustion deposition on glass substrate 1 is surprisingly advantageous in that it permits the durability of the coated article to be significantly improved as evidenced by the dramatic drop in transmittance change upon exposure to certain environmental conditions (e.g., compare Comparative Example 1 to Example 4, and compare Comparative Example 3 to Example 6). See the results shown in FIG. 5. The coated articles having the aluminum chloride based barrier layer 3 deposited via combustion deposition on glass substrate 1 (Examples 4-6) suffer much less of a transmittance change (and thus have improved durability and stability) upon exposure to environmental conditions such as heat and/or humidity compared to Examples 1-3 where the barrier layer 3 was not present.

In certain example embodiments, the coated glass of FIG. 1 may be used as a front substrate of a photovoltaic device such as a solar cell, or as a cover in a picture frame. In other example embodiments, coated glass discussed herein is designed for use in flat panel displays such as PDPs, LCDs, and/or OLEDs. Sodium diffusion from the glass substrate 1 in each case is greatly reduced by the flame-deposited barrier layer 3, thereby allowing for production of AR coatings 5 or TFTs (e.g., a-Si TFTs, poly-Si TFTs, or the like) and/or other electronic devices on the glass substrate 1 without significant deterioration of coating or display characteristics.

In depositing the aluminum chloride based barrier layer 3, certain example embodiments use an aqueous based precursor system for the deposition of the layer via flame deposition (which includes combustion deposition). The combusted material may comprise non-vaporized material (second example embodiment), and/or vaporized material (first example embodiment), which is deposited on the substrate 1 in different example embodiments of this invention. Such techniques result in an inexpensive, easy to handle, and environmentally friendly methods of generating aluminum chloride based barrier layers 3.

Figure 2:
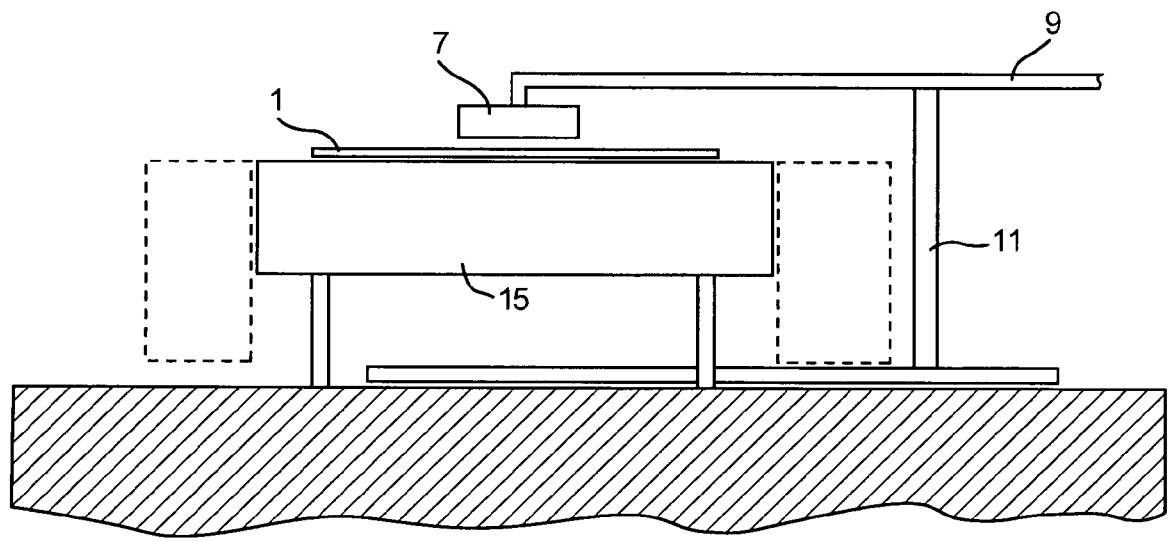
FIG. 2 is a schematic diagram illustrating an example apparatus for flame-depositing a barrier layer according to an example embodiment of this invention.

FIG. 2 is a schematic diagram illustrating an example apparatus for flame-depositing a barrier layer 3 onto glass substrate 1 according to an example embodiment of this invention. The apparatus of FIG. 2 includes burner 7 (which includes one or more flame), fuel gas tube(s) 9, burner mount 11, and machinery 15.

The aluminum chloride layer 3 may be deposited using a first type of combustion deposition in a first example embodiment of this invention, which will now be discussed. This first example of combustion deposition involves deposition of layer 3 onto substrate 1 near or in a flame of burner 7, which causes the reagents fed into the flame to chemically react. Flammable organic solvents containing elemental constituents of the desired coating in solution as dissolved reagents are sprayed through a nozzle and burned. Aluminum chloride may be provided in methanol as an example solvent in certain example embodiments of this invention. Instead of or in addition to methanol, ethanol, isopropyl alcohol or the like may instead be used as a solvent in which the aluminum chloride is provided in other example embodiments of this invention (this applies to both the first and second example embodiments discussed herein). Alternatively, reagents are fed into the flame and burned. Likewise, non-flammable solvents can be used with a gas-fueled flame. An oxidant, such as oxygen, is provided at the nozzle to react with the solvent during burning. Upon burning, reagent species present in the flame chemically react and may possibly at least partially vaporize, and then deposit and form a coating (e.g., aluminum chloride) on substrate 1 held in the combustion gases in or just beyond the flame's end. During the deposition of aluminum chloride based layer 3, oxygen is available from at least three possible sources including the oxidant gas, the surrounding gases, and the dissolved chemical reagents. The flame supplies the energy needed for deposition in the forms of the kinetic energy of the species present and radiation. This energy creates the appropriate thermal environment to form reactive species and coincidentally heats the substrate, thus providing the conditions for surface reactions, diffusion, nucleation, and growth to occur. When using combustible solutions, the solvent plays at least two roles in combustion deposition. First, the solvent conveys the coating reagents into the vicinity of the substrate where deposition occurs, thereby allowing the use of low cost soluble precursors. Uniform feed rates of any reagent stoichiometry can be produced easily by simply varying the reagents concentrations in solution and the solution flow rate. Second, combustion of the solvent (e.g., methanol and/or another alcohol as discussed herein) produces the flame required-for the combustion deposition. The combustion deposition may be performed under ambient conditions in the open atmosphere to produce layer 3 on substrate 1.

In forming layer 3 according to the first example embodiment, the reagent, or chemically reactive compound, (e.g., aluminum chloride such as $AlCl_3$) is dissolved or carried in the solvent (e.g., methanol). The aluminum chloride may be of or include $AlCl_3 \times 6H_2O$ or the like in certain example instances. The resulting solution is sprayed from a nozzle using oxygen-enriched air as the propellant gas and ignited. Substrate 1 is maintained at or near the flame's end. Flame blow-off may be reduced (e.g., prevented) by use of a hot element such as a small pilot light. The reactants vaporize (or not vaporize) in the flame and may be deposited on the substrate in vaporized or non-vaporized form as a layer 3. Alternatively, depositions can be performed by feeding solution through a nebulizer.

Figure 3A:
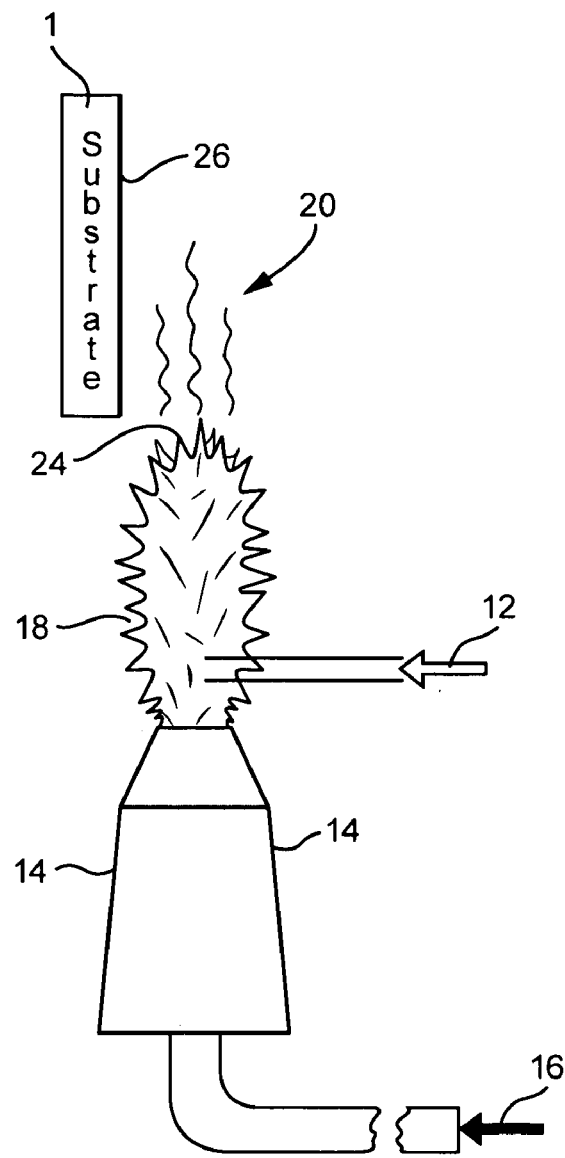
FIG. 3a is a simplified view of an example apparatus used to carry out combustion chemical deposition.
Figure 3B:
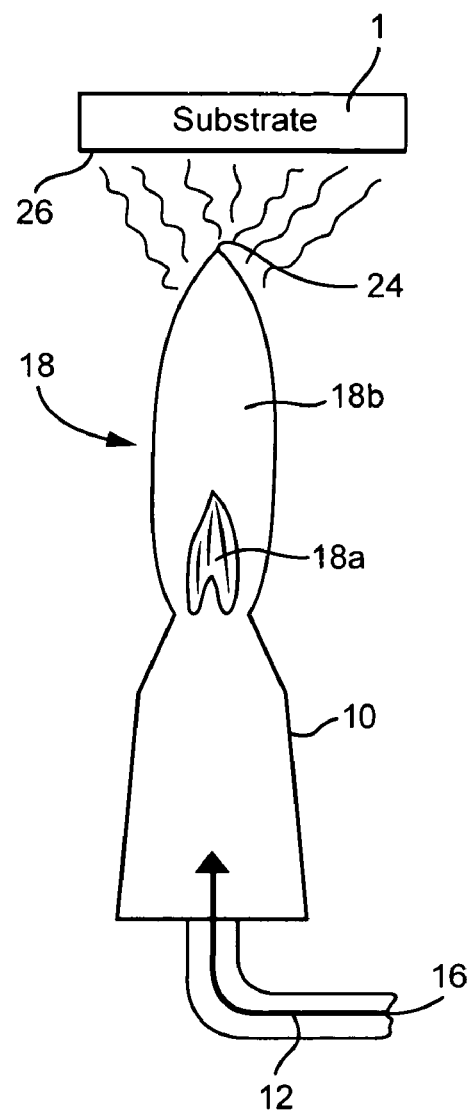
FIG. 3b is a simplified view of an apparatus similar to that shown in FIG. 3a, but configured for a non-turbulent flame.

FIG. 3a is a simplified view of a burner apparatus used to carry out combustion deposition according to an example of the first example embodiment, which produces a turbulent flame with no appreciable separate inner and outer flames. A solvent-reagent mixture (e.g., $AlCl_3$/methanol) 12 is supplied to a torch 14 or other flame-producing apparatus. The solvent-reagent solution 12 is ignited in the presence of an oxidant 16, resulting in a flame 18. The solvent-reagent solution 12 may be ignited, and the flame 18 may be maintained, if necessary, by a device such as a conventional pilot light (not shown) or a sparker. As the solvent-reagent solution 12 burns, the reagent optionally partially vaporizes (or may not vaporized) and leaves the flame 18 along with other hot gases 20 and combustion products. The apparatus shown in FIG. 3b is similar to the apparatus shown in FIG. 3a, but is configured for a non-turbulent flame, suitable for gas reagents and non-flammable carrier solutions. Flame 18 produced by torch 14 of FIG. 3b typically has the general flame characteristics of an inner flame 18a defining the reducing region where the majority of the oxidizing gas supplied with the reagent burns and an outer flame 18b defining the oxidizing region where the excess fuel oxidizes with any oxidizing gas in the atmosphere.

Referring to FIGS. 3a-3b (in burners 7 of FIG. 2), the substrate 1 to be coated is located proximate to flame 18, typically at or near the end 24 of flame 18, but within the hot gases 20 region. The surface 26 of the substrate 1 that is to be coated with barrier layer 3 is placed facing the flame 18 in some manner, either tangentially as shown in FIG. 1a or obliquely as shown in FIG. 1b, or at any angle to the flame 18 such that the hot gases 20 containing the reagent will contact the surface 26 to be coated. Alternatively, deposition may occur on the side of the substrate away from the flame. In operation, the chemically reactive compound, or reagent, (e.g., $AlCl_3$) is mixed with a flammable liquid carrier and/or solvent (e.g., methanol). The $AlC_3$ may be dissolved as a liquid solvent-reagent solution so as to spray better in the torch 14 and, consequently, flame better. The substrate 1 to be coated is placed in a position where the reagent vapors and/or particulate exiting the flame will contact the surface 26 of the substrate 1 to be coated to form layer 3. As these contact the surface 26 to be coated, the reagent vapors and/or particulates condense and form layer 3.

In a second example embodiment of this invention relating to the flame deposition technique, there are provided improvements to the first embodiment discussed above. E.g., see FIG. 4. In certain examples of the second embodiment, the material to be deposited is at least partially non-vaporized when it reaches the substrate 1. That is, the combusted material comprises at least some non-vaporized material, at least when it reaches the substrate 1. This may be accomplished in a system according to certain example embodiments where a substrate (e.g., a glass substrate) 1 is at least initially heated to a temperature of about 60° C. to about 100° C. and a flame is provided at a temperature of about 1200-1600K, but the temperature may be adjusted somewhat, of course, based on the combustion conditions and materials used. Thus, it will be appreciated that in certain example embodiments the flame and/or substrate temperatures preferably are kept below those that would completely vaporize the material. Moreover, although there may be some vapor pressure associated with the material in some implementations, certain example embodiments will maintain the material in an at least partially solid state. Keeping the material in the at least partially solid state may be accomplished by, for example, controlling the concentration and/or droplet size. With respect to the latter, it is possible in certain example embodiments to nebulize the material and/or render it an aerosol so as to make the material behave as if it were a vapor even though the combusted material is, in fact, at least partially (and sometimes substantially) non-vaporized. Details for such an example atomization process involve creating a system capable of producing an average droplet size of about 3 µm, with substantially all droplets falling within the range of about 1 to 5 µm. This helps to ensure maximum precursor delivery through the burner to the flame and to reduce any condensation or deposition inside the burner head. The deposited barrier layer 3 of certain example embodiments, practically speaking, may range from about 5 nm to a few hundred nm thick, depending on the intended application.

Figure 4:
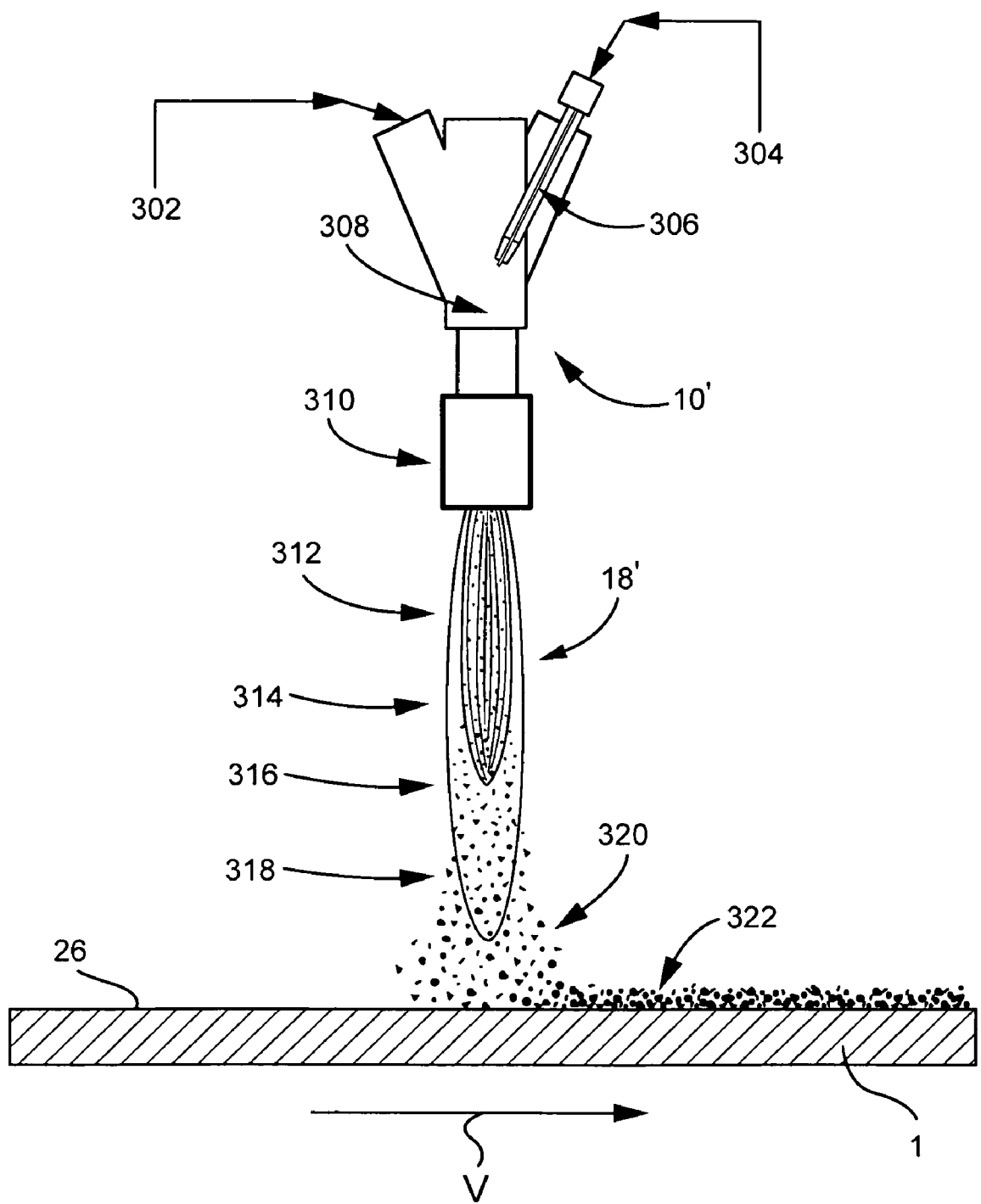
FIG. 4 is a simplified view of an example apparatus used to carry out combustion chemical deposition according to a second example embodiment of this invention.

FIG. 4 is a simplified view of an example apparatus 10' used to carry out flame deposition in accordance with the second example embodiment. A combustion gas 302 (e.g., a propane air combustion gas) is fed into the apparatus 10', as is a suitable aqueous based precursor 304 (e.g., via insertion mechanism 306). The precursor 304 may include of be of a mixture of methanol and $AlCl_3$ in certain example embodiments of this invention. Precursor nebulization (308) and at least partial precursor evaporation (310) occurs within the apparatus 10'. There flame 18' may be thought of as including multiple areas. Such areas correspond to chemical reaction area 312 (e.g., where reduction, oxidation, and/or the like may occur), nucleation area 314, coagulation area 316 and agglomeration area 318. Of course, it will be appreciated that such example areas are not discrete and that one or more of the above processes may begin, continue, and/or end throughout one or more of the other areas. Particulate matter 320 begins forming within the flame 18' and moves downward towards the surface 26 of the substrate 1 to be coated, resulting in film growth 322. As will be appreciated from FIG. 4, the combusted material comprises non-vaporized material (e.g., particulate matter), which is also at least partially in particulate form when coming into contact with the substrate 1 in forming layer 3. To deposit the coating, the substrate 1 may be moved (e.g., in the direction of velocity vector V). Of course, it will be appreciated that the present invention is not limited to any particular velocity vector, and that other example embodiments may involve the use of multiple apparatuses 10' for coating different portions of the substrate 1, may involve moving a single apparatus 10' while keeping the substrate in a fixed position, etc.

An example soda-lime-silica base glass for substrate 1 according to certain embodiments of this invention, on a weight percentage basis, includes the following basic ingredients:

TABLE 1

Example Base Glass

| Ingredient | Wt. % |
|---|---|
| $SiO_2$ | 67-75% |
| $Na_2O$ | 10-20% |

TABLE 1-continued

Example Base Glass

| Ingredient | Wt. % |
|---|---|
| CaO | 5-15% |
| MgO | 0-7% |
| $Al_2O_3$ | 0-7% |
| $K_2O$ | 0-7% |

Other minor ingredients, including various refining aids, such as salt cake, crystalline water and/or the like may also be included in the base glass. In certain embodiments, for example, glass herein may be made from batch raw materials silica sand, soda ash, dolomite, limestone, with the use of salt cake ($SO_3$) as a refining agent (or of course boron oxide as discussed above). Reducing and oxidizing agent(s) may also be used in certain instances. In certain instances, soda-lime-silica base glasses herein include by weight from about 10-15% $Na_2O$ and from about 6-12% CaO. In addition to the base glass materials discussed above, the glass batch and/or final glass may include a colorant portion including material (s) such as iron, erbium, cobalt, selenium and/or the like. In certain example embodiments of this invention, the amount of total iron in the glass may be from about 0.05 to 1.2%, more preferably from about 0.3 to 0.8%. In the case of certain clear high transmission glasses, the total iron may be from about 0.005 to 0.025%. The total amount of iron present in the glass, and thus in the colorant portion thereof, is expressed herein in terms of $Fe_2O_3$ in accordance with standard practice. This, however, does not imply that all iron is actually in the form of $Fe_2O_3$. Likewise, the amount of iron in the ferrous state is reported herein as FeO, even though all ferrous state iron in the glass may not be in the form of FeO.

The presence of $AlCl_3$ in barrier layer 3 blocks or greatly reduces sodium migration from the substrate 1 in certain example embodiments. This is especially the case when the aluminum chloride layer 3 is applied to a hot glass surface of substrate 1, such as when the glass surface is at a temperature at or above Tg. Consider the following chemical reaction for example: $AlCl_3+Na^++H_2O \rightarrow Al_3+NaCl+HCl$ (e.g., non-stoichiometric). The $Al_3(+)$ from layer 3 gets integrated in or adjacent the glass network and stabilizes them possibly as an Albite-like phase→$Na[AlSi_3O_8]$. A Mullite phase, $3Al_2O_3 \times 2SiO_2$ may be even more stable. In certain example embodiments, Albite and Mullite phases may be caused to coexist proximate the interface of glass 1 and barrier layer 3. The $AlCl_3$ 3 on the surface of the glass 1 creates a chemical reaction between the Cl (from the $AlCl_3$) and alkali element (s) (e.g., Na and/or K) and/or alkaline earth element(s) (e.g., Ca and/or Mg) from the glass. For example, $Na_2O$ of the glass matrix may react with $Cl_2$ from the $AlCl_3$ to form NaCl (NaCl→Na+Cl), and the oxygen may be removed as an oxychloride or the like; moreover, HCl and/or $H_2O$ can be removed in vapor form. In a similar manner, $K_2O$ of the glass matrix reacts with $Cl_2$ (from the $AlCl_3$) to form KCl. As another example, CaO of the glass reacts with $Cl_2$ (from the $AlCl_3$) to form $CaCl_2$. Accordingly, it will be appreciated that treatment of the glass surface with aluminum chloride such as $AlCl_3$ is an efficient technique for reducing the ability of alkali and/or alkaline earth element(s) to leach out of the glass 1 and stain the surface thereof and/or damage a coating 5 thereon (e.g., during heat treatment such as thermal tempering).

As noted above, in flame deposition (see FIGS. 2-4) of the aluminum chloride based layer 3, $AlCl_3$ may provided in a solvent such as an alcohol (e.g., methanol) so make up the mixture to be introduced to the flame/burner. The mixture may be from about 1-25% $AlCl_3$ (more preferably from about 2-20%, even more preferably from about 3-15%, and most preferably from about 5-10% $AlCl_3$), with the remainder being made up of solvent in certain example embodiments of this invention. The weight ratio of $AlCl_3$:solvent in the mixture to be introduced to the flame/burner may be from about 1:8 to 1:40, more preferably from about 1:10 to 1:20 (where methanol is an example solvent), in certain example embodiments. It has been found that these ratios provide the best results for application and treatment.

In certain example embodiments, the aluminum chloride treatment (or application of aluminum chloride based barrier layer 3) may be performed at or just before the annealing lehr in a float-glass making process. In this respect, see U.S. Ser. Nos. 11/878,318 and 11/492,204, the disclosures of which are hereby incorporated herein by reference. As noted above, in the aluminum chloride treatment 10, $AlCl_3$ may be provided in a solvent such as an alcohol (e.g., methanol) to make up the mixture. It is possible that the aluminum chloride may also be provided in water in certain instances to make up the mixture. The mixture is preferably from about 1-25% $AlCl_3$ (more preferably from about 2-20%, even more preferably from about 3-15%, and most preferably from about 5-10% $AlCl_3$), with the remainder being made up of solvent or water in certain example embodiments of this invention. The weight ratio of $AlCl_3$:solvent in the mixture is preferably from about 1:8 to 1:40, more preferably from about 1:10 to 1:20 (where methanol is an example solvent). It has been found that these ratios provide the best results for application and treatment. It has also been found that the glass temperature range at which the aluminum chloride treatment is applied in forming layer 3 is also significant in certain instances. In particular, the glass 1 has to be hot enough to accept the treatment and promote good reaction of the aluminum chloride with elements of the glass, but must be cool enough so that corrosive byproducts of the treatment such as HCl do not cause significant damage to the manufacturing components or the glass itself. It has been found that it is desirable to apply the aluminum chloride for layer 3 to the glass surface during treatment when the glass 1 is at a temperature of at least about 400 degrees C., more preferably from about 550 degrees C. to 900 degrees C., more preferably from about 580 degrees C. to 850 degrees C., and most preferably from about 590 degrees C. to 800 degrees C.

The AR coating 5 on the glass substrate 1, over the aluminum chloride based barrier layer, may be of any suitable material. In certain example embodiments, the AR coating 5 may be silica based so as to have a refractive index of no more than about 1.6. Thus, the AR coating 5 may comprise or consist essentially of $SiO_2$ in certain example embodiments of this invention, although other materials may instead or additionally be used. Example AR coatings 5 (e.g., applied via sol gel or the like) are described, for example and without limitation, in U.S. Patent Document Nos. 2007/0178316, 2007/0116966, 2007/0113881, 2007/0031655, and 2007/0030569, all of which are hereby incorporated herein by reference.

EXAMPLES

The following examples are provided for purposes of example only and are not intended to be limited unless expressly claimed. Comparative Examples 1-3 did not include the aluminum chloride based barrier layer 3, whereas Examples 4-6 did include the aluminum chloride based barrier layer 3 on the glass 1 under the AR coating 5.

In Comparative Example 1, a silica solution for AR coating 5 was prepared as follows. A polymeric component of silica was prepared by using 64% wt. of n-propanol, 24% wt. of glycydoxylpropyltrimethoxysilane (Glymo), 7% wt. of water and 5% wt. of hydrochloric acid. These ingredients were used and mixed for 24 hours. The coating solution was prepared by using 21% wt. of polymeric solution, 7% wt. colloidal silica in methyl ethyl ketone supplied by Nissan Chemicals Inc., and 72% wt. n-propanol. This was stirred for two hours to provide silica sol. The final solution is referred to as silica sol for AR coating 5. The AR silica coating 5 was applied to glass substrate 1 using a spin coating method with 1000 rpm for 18 seconds. The AR coating 5 along with the glass substrate 1 were heat treated in a furnace at about 625 degrees C. for three and a half minutes. The coated article was also exposed to high humidity and freeze conditions: ramp-heat from room temperature (25 degrees C.) to 85 degrees C. @ 100 C/hr; bring RH up to 85%. Cycle 1—dwell @ 85 degrees C./85% RH for 1200 minutes. Ramp-cool from 85 degrees C. to −40 degrees C. @ 100 degrees C./hr.; bring RH down to 0%. Cycle 2—dwell at −40 degrees C/0% RH for 40 minutes. Ramp-heat from −40 degrees C. to 85 degrees C. at 100 degrees C./hr., bring up RH to 85%. Repeat-repeat for 10 cycles or 240 hours. A spectral plot from 0-1500 nm as well as an integrated percent transmission per ASTM E424-71 (incorporated herein by reference) using the above mentioned procedure were performed. The change in transmittance before and after the above testing of Example 1 is 13.39 as set forth in FIG. 5.

Example 2 was similar to Example 1, except that article was exposed to damp testing (85 degrees C. and 85% RH) for 40 days per IEC61215. The change in transmittance before and after the testing was 3.60, as shown in FIG. 5.

Example 3 was similar to Example 1, except that the article was exposed to thermal cycle (−40 to +85 degrees C.) with condensation minimization and air circulation for 20 days per IEC 61215. The transmission measurements were done using a PerkinElmer UV-VIS Lambda 950 before and after the environmental testing. The change in transmittance before and after testing was 1.31 as shown in FIG. 5.

In Example 4, an aluminum chloride based barrier layer 3 was also provided on the glass substrate 1, under the AR coating 5. For Example 4, the $AlCl_3$/methanol application method to a hot glass surface of substrate 1 via gas burner is shown in FIG. 2. An example advantage of this method is the easy dosage and application of the reacting $AlCl_3$. The $AlCl_3$/methanol mixture was used in a ratio of 1:20 and 1:10 wt. The surface of glass substrate 1 was at a temperature above Tg. The thickness of the aluminum chloride barrier layer 3 applied via the burner was about 50 nm which was measured via scanning electron microscopy. The top-coat AR layer 5 provided on the substrate 1 over the barrier layer 3 was made as described above in Example 1 via a sol gel application technique. The coated article was exposed to high humidity and freeze conditions as discussed above in Example 1. The transmission was measured before and after the testing, as in Example 1. The change in transmittance before and after the testing of Example 4 was 1.73 as shown in FIG. 5 (a significant improvement over the 13.39 of Example 1 where the aluminum chloride barrier layer 3 was not present).

Example 5 was similar to Example 4, except that the coating was exposed to damp testing as mentioned above in Example 2. The change in transmittance before/after the testing was 3.56 as shown in FIG. 5.

Example 6 was similar to Example 4, except that the coating was exposed to thermal testing as discussed above in Example 3. The change in transmittance before and after the testing of Example 6 was 0.02 as shown in FIG. 5 (a significant improvement over the 1.31 of Example 3 where the aluminum chloride barrier layer 3 was not present).

As can be seen above by comparing Comparative Examples 1-3 with Examples 4-6, the addition of the aluminum chloride based barrier layer 3 deposited via combustion deposition on glass substrate 1 is surprisingly advantageous in that it permits the durability of the coated article to be significantly improved as evidenced by the dramatic drop in transmittance change upon exposure to certain environmental conditions (e.g., compare Comparative Example 1 to Example 4, and compare Comparative Example 3 to Example 6). The coated articles having the aluminum chloride based barrier layer 3 deposited via combustion deposition on glass substrate 1 (Examples 4-6) suffer much less of a transmittance change (and thus have improved durability and stability) upon exposure to environmental conditions such as heat and/or humidity.

Once given the above disclosure many other features, modifications and improvements will become apparent to the skilled artisan. Such features, modifications and improvements are therefore considered to be a part of this invention, the scope of which is to be determined by the following claims:

What is claimed is:

1. A method of making a coated article, the method comprising:
providing soda-lime-silica based glass comprising a base glass portion that includes:

| Ingredient | wt. % |
| --- | --- |
| $SiO_2$ | 67-75% |
| $Na_2O$ | 10-20% |
| CaO | 5-15% |
| $Al_2O_3$ | 0-7% |
| $K_2O$ | 0-7% | using combustion deposition and at least one burner to deposit a barrier layer comprising aluminum chloride on a surface of the glass when the surface of the glass is at a temperature of at least about 400 degrees C., thereby forming the barrier layer comprising aluminum chloride on the glass;
forming an antireflective (AR) coating on the glass over at least the barrier layer comprising aluminum chloride.

2. The method of claim 1, wherein the barrier layer comprising aluminum chloride is deposited on the glass, at or just prior to an annealing lehr of a float glass manufacturing apparatus, when the surface of the glass is at a temperature(s) of from about 540 degrees C. to 850 degrees C.

3. The method of claim 1, further comprising, after forming the barrier layer comprising aluminum chloride on the glass, polishing down an opposite major surface of the glass opposite to a major surface to which the barrier layer was applied, in order to reduce a thickness of the coated glass.

4. The method of claim 1, wherein the AR coating comprises silica and has a refractive index (n) of no more than about 1.6.

5. The method of claim 1, wherein the AR coating is applied to the glass via a sol gel technique.

6. The method of claim 1, wherein a mixture comprising $AlCl_3$ and at least one solvent comprising alcohol is provided to the burner in depositing the barrier layer comprising aluminum chloride on the surface of the glass.

7. The method of claim 6, wherein the solvent comprises methanol.

8. The method of claim 6, the mixture comprising $AlCl_3$ and the solvent is characterized by a $AlCl_3$/solvent weight ratio of from about 1:8 to 1:40.

9. The method of claim 6, the mixture comprising $AlCl_3$ and the solvent is characterized by a $AlCl_3$/solvent weight ratio of from about 1:10 to 1:20.

10. A method of making a coated article, the method comprising:
providing a glass substrate;
using flame deposition and at least one burner to deposit a barrier layer comprising aluminum chloride on the glass substrate when at least part of the glass substrate is at a temperature of at least about 400 degrees C., thereby forming the barrier layer comprising aluminum chloride on, directly or indirectly, the glass substrate;
forming an antireflective (AR) coating, including one or multiple layers, on the glass substrate over at least the barrier layer comprising aluminum chloride.

11. The method of claim 10, wherein the barrier layer comprising aluminum chloride is deposited on the glass, at or just prior to an annealing lehr of a float glass manufacturing apparatus, when the surface of the glass is at a temperature(s) of from about 540 degrees C. to 850 degrees C.

12. The method of claim 10, further comprising, after forming the barrier layer comprising aluminum chloride on the glass, polishing down an opposite major surface of the glass opposite to a major surface to which the barrier layer was applied, in order to reduce a thickness of the coated glass.

13. The method of claim 10, wherein the AR coating comprises silica and has a refractive index (n) of no more than about 1.6.

14. The method of claim 10, wherein the AR coating is applied to the glass via a sol gel technique.

15. The method of claim 10, wherein a mixture comprising $AlCl_3$ and at least one solvent comprising alcohol is provided to the burner in depositing the barrier layer comprising aluminum chloride on the surface of the glass.

16. The method of claim 15, wherein the solvent comprises methanol.

17. The method of claim 15, the mixture comprising $AlCl_3$ and the solvent is characterized by a $AlCl_3$/solvent weight ratio of from about 1:8 to 1:40.

18. The method of claim 15, the mixture comprising $AlCl_3$ and the solvent is characterized by a $AlCl_3$/solvent weight ratio of from about 1:10 to 1:20.

* * * * *